United States Patent
Williams et al.

[11] Patent Number: 6,114,869
[45] Date of Patent: Sep. 5, 2000

[54] METHOD AND APPARATUS FOR INTERFACING BETWEEN AUTOMATIC WAFER PROBE MACHINES, AUTOMATIC TESTERS, AND PROBE CARDS

[75] Inventors: Scott R. Williams; Martin A. Kurtz, both of Mesa, Ariz.

[73] Assignee: Cerprobe Corporation, Gilbert, Ariz.

[21] Appl. No.: 09/082,896

[22] Filed: May 21, 1998

[51] Int. Cl.[7] .............................. G01R 31/02; G01R 31/26
[52] U.S. Cl. ........................... 324/765; 324/754; 324/758
[58] Field of Search .................... 324/754–759, 324/765

[56] References Cited

U.S. PATENT DOCUMENTS

| | | | |
|---|---|---|---|
| 5,489,853 | 2/1996 | Nakajima | 324/754 |
| 5,923,180 | 7/1999 | Botka et al. | 324/758 |

*Primary Examiner*—Josie Ballato
*Assistant Examiner*—Russell M. Kobert
*Attorney, Agent, or Firm*—Cahill, Sutton & Thomas P.L.C.

[57] ABSTRACT

A system for interfacing between a semiconductor wafer, an automatic wafer probe machine, and an automatic IC test system includes an insert ring adapted for attachment to a support of the wafer probe machines. A lock ring assembly includes a lock ring rotatably disposed in the insert ring. A cam element having a sloped camming surface is attached to the lock ring. A retaining element attached to the insert ring retains the lock ring in the insert ring. A lid hingeably attached to the insert ring supports a POGO tower assembly including an adapter ring for attachment to a POGO tower and a z-axis ring attached to the adapter ring, and a mounting assembly connecting the z-axis ring in spring-loaded relationship to the lid. A cam follower attached to the z-axis ring engages the sloped camming surface when the lid is lowered to position a bottom surface of the POGO tower slightly above the probe card. The cam follower follows the camming surface lower as the lock ring is rotated to force POGO pins at the bottom of the POGO tower against contact pads of the probe card.

16 Claims, 8 Drawing Sheets

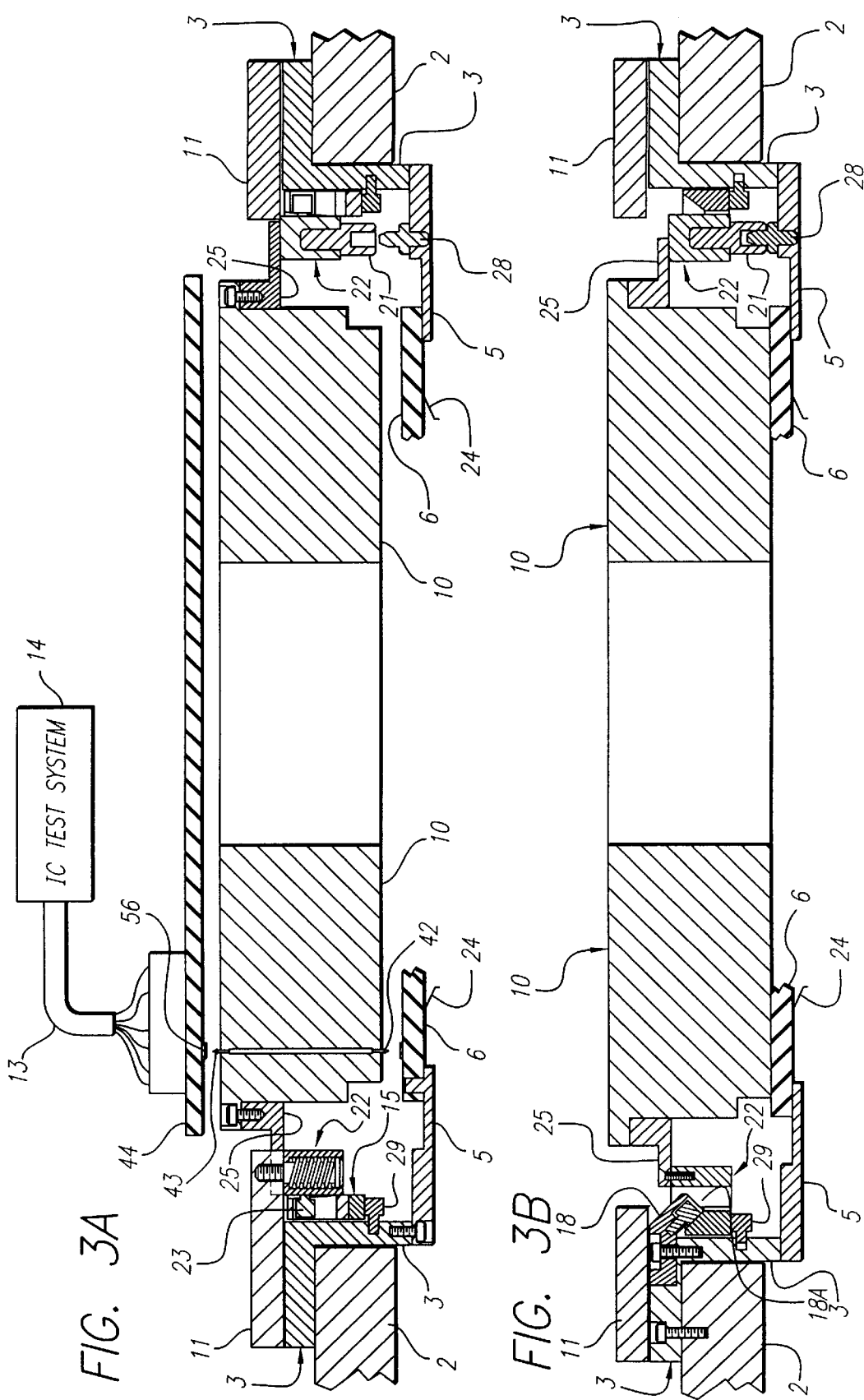

METHOD AND APPARATUS FOR INTERFACING BETWEEN AUTOMATIC WAFER PROBE MACHINES, AUTOMATIC TESTERS, AND PROBE CARDS

BACKGROUND OF THE INVENTION

The invention relates to apparatus and methods for interfacing between automatic wafer probe machines, automatic integrated circuit testers, and probe cards which support needles that make electrical contact with bonding pads of integrated circuits on wafers, and more particularly to improvements that allow inexpensive, rapid, convenient upgrading of an entire wafer probe test system without complete redesign of the interface apparatus.

Each semiconductor wafer may include hundreds of integrated circuit die (i.e., chips), and it is necessary to "probe test" each die before the wafer is cut into the individual integrated circuit die which then are packaged. Such testing requires the bonding pads of each chip to be electrically connected to an automatic tester. In a typical probe test system, a "test head" supports an "interface assembly". The interface assembly supports a "probe card". The probe card supports all of probe needles required to probe test a particular semiconductor die. The tips of the probe needles must provide electrical contact with corresponding bonding pads of the die under test (DUT). The shank of a probe needle is typically 5 to 10 mils in diameter, and the wafer to be probed is supported on a wafer chuck of a "wafer probe machine" that automatically handles wafers. The chuck provides indexed translation in the x and y directions to bring the individual chip bonding pads into alignment with the pins of a probe card and is moveable in the z direction to press the chip bonding pads against the contact tips of the probe needles. After alignment of the probe needles with the corresponding bonding pads of the integrated circuit die has been accomplished, the wafer chuck is raised through an appropriate distance to cause the probe tips to contact the bonding pads of the chip to be tested next. The die testing often needs to be performed at high speed or high frequency, for example at a 200 MHz data rate, or even much higher.

Typically, a semiconductor integrated circuit wafer fabrication facility purchases a state-of-the-art wafer probe machine. The integrated circuit fabrication facility also buys a state-of-the-art electronic "automatic IC test system" which executes computer programs to (1) generate the necessary operating stimulus signals that need to be applied to the DUT to cause it to operate, and (2) measure the response signals produced by the integrated circuit in response to the stimulus signals. The probe card applies the stimulus signals via some of the test needles and measures response signals on those and/or other needles in order to test the DUT.

Thus, the "interface system" constitutes the mechanical fixturing supported by the wafer probe machine to (1) hold the probe card and (2) provide the electrical signal paths between the probe card and the automatic IC test system.

The closest prior art is believed to be the assignee's own prior interface systems, which have included (1) a "base system" in which a probe card is supported in a probe card tray, and (2) an insert ring which includes suitable camming surfaces that receive corresponding cam elements attached to a "POGO tower" to compress its lower spring-loaded POGO pin contacts against corresponding conductive pads on the upper surface of the probe card. Such POGO towers (which include so-called "direct docking" POGO towers and "cable" POGO towers) include an annular ring carrying double ended, spring-loaded, electrically conductive POGO pins that extend downward from the bottom surface of the POGO tower to the conductive pads of the probe card. (In a direct docking POGO tower, the upper ends of the POGO pins contact conductive pads of a PIB ("performance interface board") which provides electrical paths to a test head of the electronic test system. In a cable type POGO tower, the upper ends of the POGO pins directly contact corresponding conductors of a cable system connected to the electronic test system.)

Referring to FIG. 1, which discloses a portion of the above mentioned prior art thought to be most relevant to the present invention, interface system 1 includes an insert ring 3 suitably attached to a support surface 2A of an automatic probe machine 2. Insert ring 3 includes a cylindrical opening in which a rotatable lock ring assembly 15 includes three cam slots each having a sloped upper cam surface 7. Lock ring assembly 15 is rigidly connected to handle 4. The upper cam surfaces 7 serve as sloped ramps that can be followed downward as lock ring assembly rotates in the direction of arrow 12 by three subsequently described corresponding cam followers 23 that are rigidly attached to the outer cylindrical wall of a POGO tower 10. POGO tower 10 is coupled by multiple conductors 13 to an automatic electronic IC test system 14.

POGO tower 10 is supported by a lid 11 which is attached by a hinge assembly 18 to insert ring 3. A probe card tray 5 is rigidly attached to the bottom of insert ring 3, and supports a probe card 6 having conductive pads to be contacted by spring-loaded lower POGO pin contacts (not shown) extending from the bottom surface of POGO tower 10. After lid 11 and POGO tower 10 have been lowered so that cam followers 23 are located in the open ends of the cam slots and the POGO pin contacts are about 0.1 inches above the corresponding conductive pads on the probe card 6, handle 4 is rotated in the direction of arrow 12 so that the upper cam surfaces 7 cause cam followers 23 and hence POGO tower 10 to be pulled a predetermined distance downward to press the spring-loaded POGO pin lower contacts against the corresponding conductive pads on probe card 6.

Cam blocks 18 are attached to the upper surface of insert ring 3. Cam blocks 18 each support a cam follower 18A at a suitable angle so cam followers 18A roll on sloped arcuate surfaces 16 on the upper outer edge of lock ring assembly 15. Cam followers 18A counter the upward force produced on lock ring assembly 15 by the compressed POGO pins.

The main problems of the closest prior art interface systems occur because nearly every interface system is different. It should be understood that various users of wafer probe/test systems make very large investments to purchase a wide variety of different commercially available IC electronic test systems, automatic wafer probe machines, POGO towers, and/or probe cards. Consequently, nearly every complete wafer probe/test system is "built to order". Therefore, an entire new interface system ordinarily must be designed every time a user purchases an up-to-date electronic IC test system, automatic probe machine, probe card, and/or associated POGO tower. Such "building to order" of an interface system requires a considerable amount of time because it is impractical for a business concern providing interface systems to attempt to maintain an inventory of all of the components of a large number of slightly different "standard" interface systems.

SUMMARY OF THE INVENTION

Accordingly, it is an object of the invention to reduce the cost required to provide an interface system that is to be operatively coupled to an updated automatic IC test system, wafer probe machine, or probe card of an integrated circuit wafer test system.

It is another object of the invention to reduce the amount of time required to provide an interface system which is properly operable with a different automatic IC test system, wafer probe machine, or probe card.

It is another object of the invention to provide a partially standardized interface system which can be included as an integral part of a wafer probe machine.

It is another object of the invention to reduce the amount and cost of training required to teach users how to use interface systems of an integrated circuit wafer test system.

It is another object of the invention to provide an interface system for an integrated circuit wafer test system wherein it is practical to maintain an inventory of components of the interface system.

It is another object of the invention to provide an interface system that allows all components, including the POGO tower, to remain assembled in the interface system while a probe card is being removed and replaced.

It is another object of the invention to provide an interface system having a constant vertical "profile", wherein the z-axis locations of the probe card, the top, and the bottom of the POGO tower are the same for all POGO towers which may be used therein.

It is another object of the invention to provide an interface system wherein a direct docking type of POGO tower and a cable type of POGO tower can be used interchangeably.

It is another object of the invention to provide an interface system which provides a larger lock ring opening to accommodate use of a larger probe card and also allows reducing the height of the lock ring.

Briefly described, and in accordance with one embodiment thereof, the invention provides a system for interfacing between an integrated circuit die on a semiconductor wafer and (1) an automatic wafer probe machine, and (2) an automatic integrated circuit test system, including an insert ring (3) adapted for attachment to a support of the wafer probe machines and a lock ring assembly including a lock ring (16) rotatably disposed within an opening of the insert ring (3), the lock ring (16) having an upper camming surface (16A) and a lower camming surface (7), and a cam element (17) attached to the lock ring (16). A support element (29) is rigidly attached to the insert ring for engaging the lower camming surface to support the lock ring (16) in the opening. A retaining element (18) is rigidly attached to the insert ring (3) for engaging the upper camming surface (16A) to retain the lock ring in the opening. A probe card support (5) attached to a bottom portion of the insert ring (3) for supporting a probe card (6) in fixed relation to the insert ring. A lid (11) is hingeably attached to the insert ring (3) and supports a POGO tower assembly including a first ring section (25) adapted for rigid connection to a POGO tower, a second ring section (22) rigidly connected to the first ring section, and a mounting assembly connecting the second ring section (22) in spring-loaded relationship to the lid (11). A cam follower (23) is rigidly attached to the second ring section (22) for engaging a sloped camming surface (7) of the cam element (17) when the lid (11) is lowered to position a bottom surface of the POGO tower (10) a predetermined distance above the probe card (6) and following the camming surface (7) lower as the lock ring (16) is rotated in a predetermined direction to force POGO pins (10A) at the bottom of the POGO tower (10) against contact pads of the probe card (6). An alignment bushing (21) is rigidly connected in fixed relation to one of the probe card supports (5) and the second ring section (22), and an alignment pin (28) for engaging the alignment busing as the second ring section (22) is drawn toward the probe card (6) by the cam follower (23) to precisely align the POGO tower (10) to the probe card (6).

BRIEF DESCRIPTION OF THE DRAWINGS

FIG. 3A is a partial section view useful in explaining FIGS. 2A and 2B.

FIG. 3B is another partial section view similar to that of FIG. 3A after the POGO tower has been compressed against the probe board.

DETAILED DESCRIPTION OF THE PREFERRED EMBODIMENTS

Figure 1:
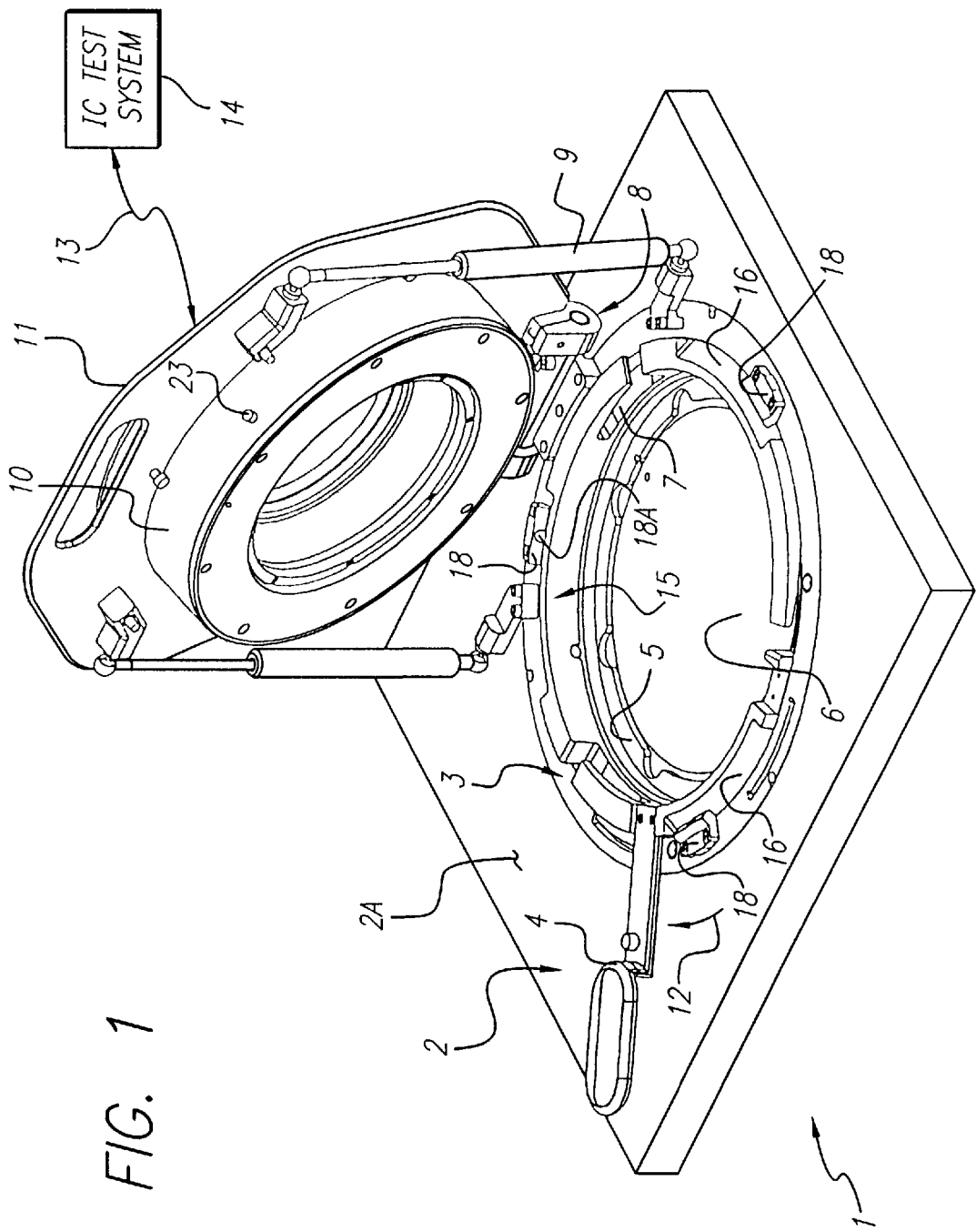
FIG. 1 is a partial perspective view of a prior art interface system.
Figure 4A:
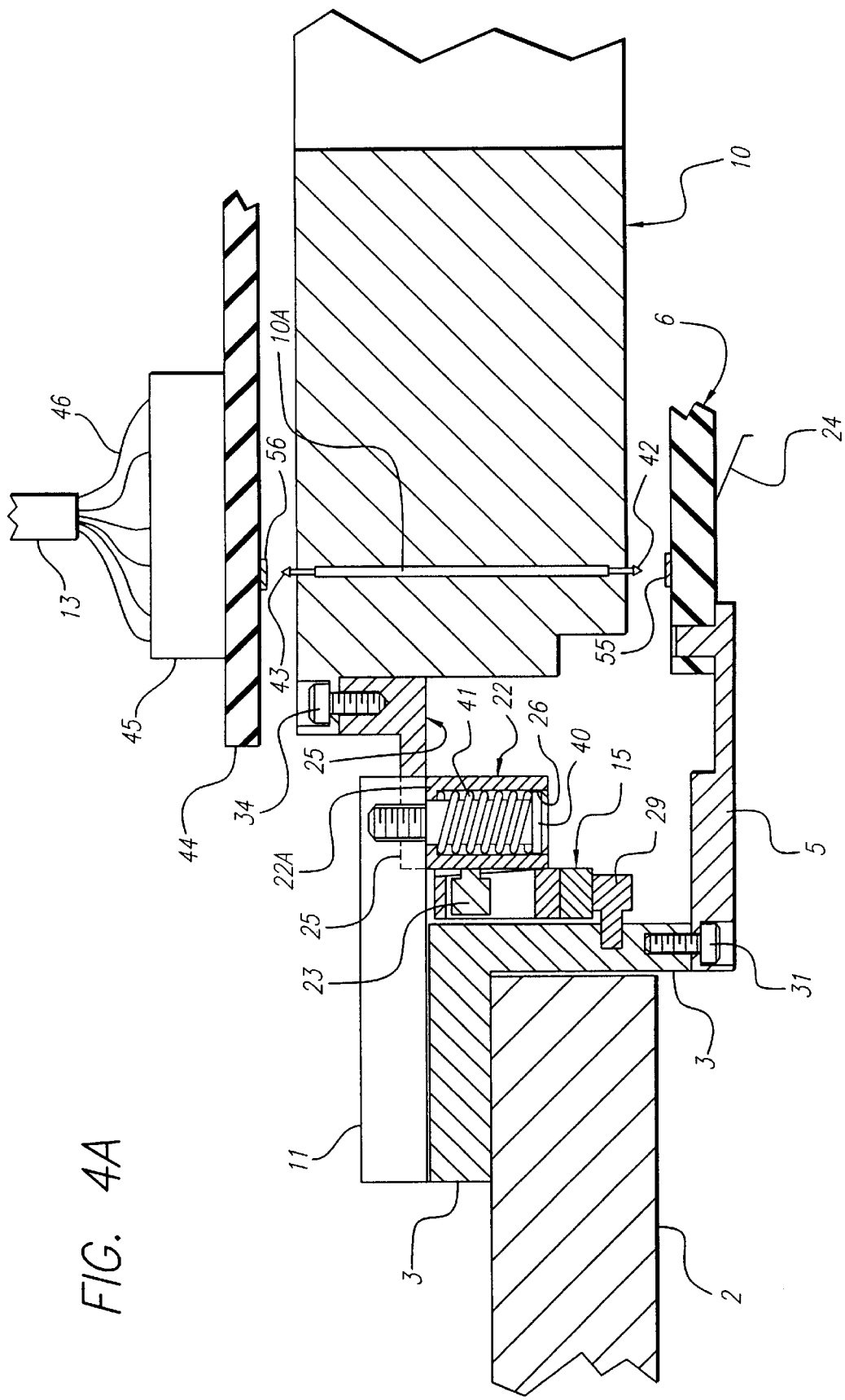
FIG. 4A is an enlarged partial section view illustrating a portion of FIG. 3A.
Figure 4B:
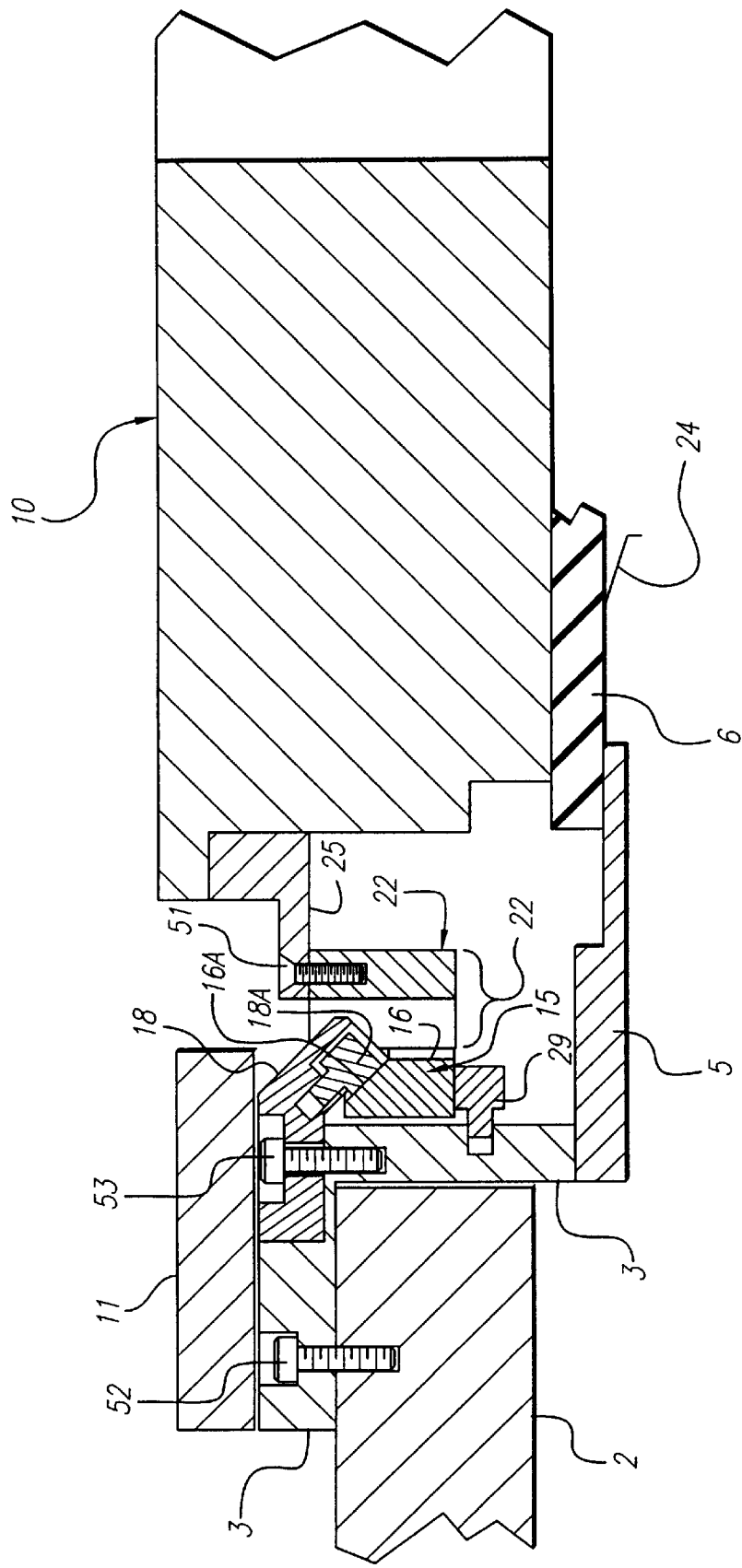
FIG. 4B is a partial section view similar to FIG. 4A useful in explaining FIG. 3B.

Referring to FIGS. 2A and 2B and FIGS. 4A–D, insert ring 3 is attached by bolts to a support surface 2A of an automatic wafer probe machine 2, as previously described with reference to prior art FIG. 1. Holes 19 in insert ring 3 are utilized for the attachment bolts 52 (FIG. 4B). As in prior art FIG. 1, lid 11 is attached by means of hinge assembly 8 to insert ring 3. Suitable gas shock absorbers 9 are provided as illustrated, to cushion the descent of lid 11 toward a limiting position above and in alignment with insert ring 3, so that the lower contacts 42 (FIG. 4C) of the lower POGO pins of POGO tower 10 (FIG. 2B) are about 0.1 inches above probe card 6.

Lock ring assembly 15 is rigidly connected to handle 4 and is rotatably disposed within a large cylindrical opening of insert ring 3. The thickness of lock ring assembly 15 is minimized to provide the largest practical diameter of the central opening of lock ring 15. Three cam hook elements 17, spaced approximately 120 degrees apart, are rigidly attached to an upper surface of a main ring 16 of lock ring assembly 15. Three arcuate upper cam follower surfaces 16A are provided on the upper inner edge of main lock ring 16, in contrast to the corresponding arcuate upper cam follower surfaces 16A of prior art FIG. 1, which are on the upper outer edges of the lock ring.

Figure 2A:
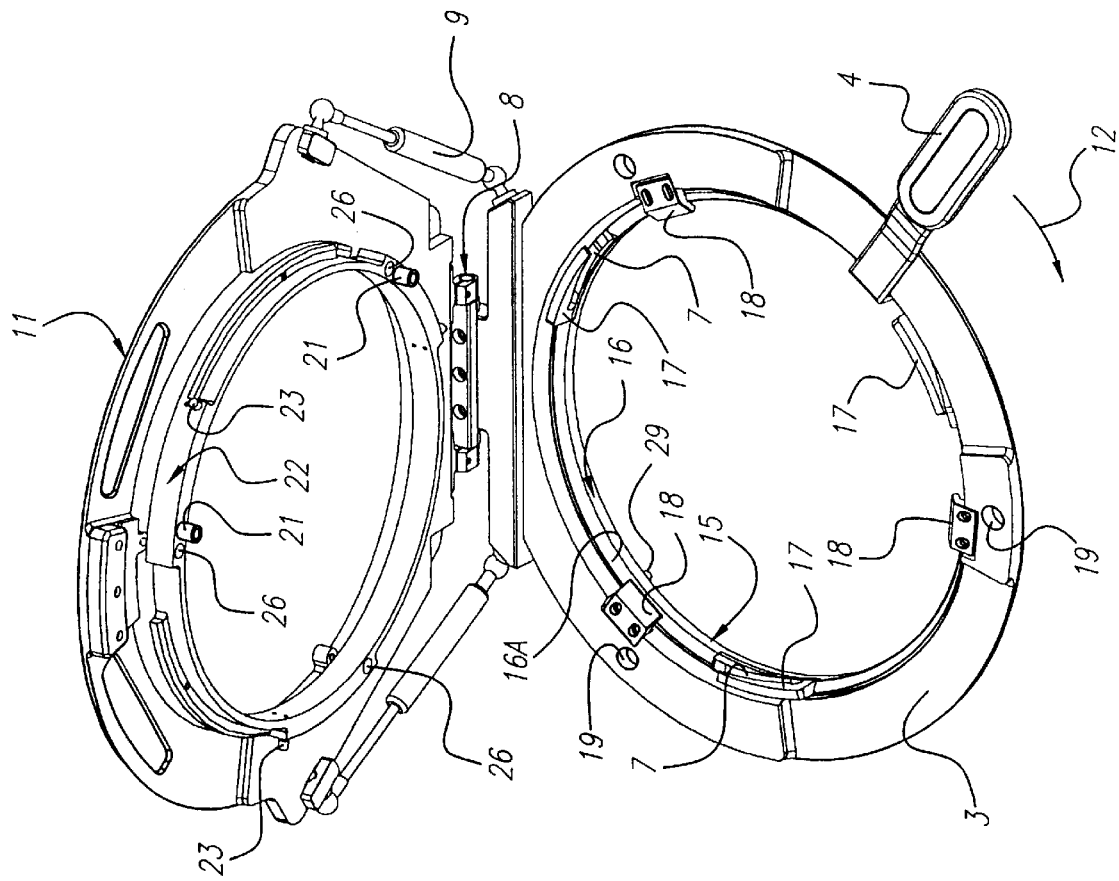
FIG. 2A is a partial perspective view of an interface system of the present invention.
Figure 4C:
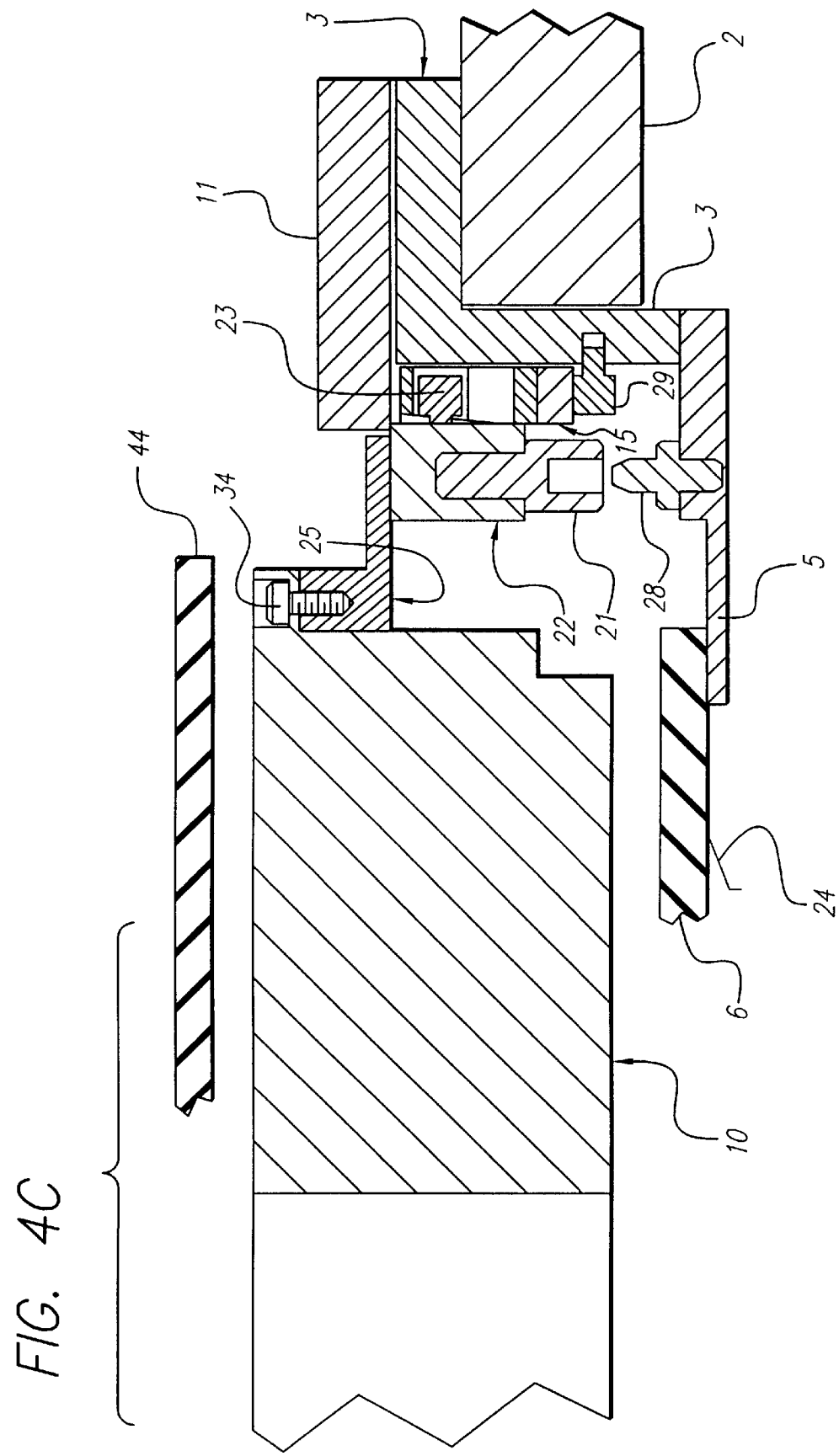
FIG. 4C is a partial section view illustrating an alignment feature.
Figure 4D:
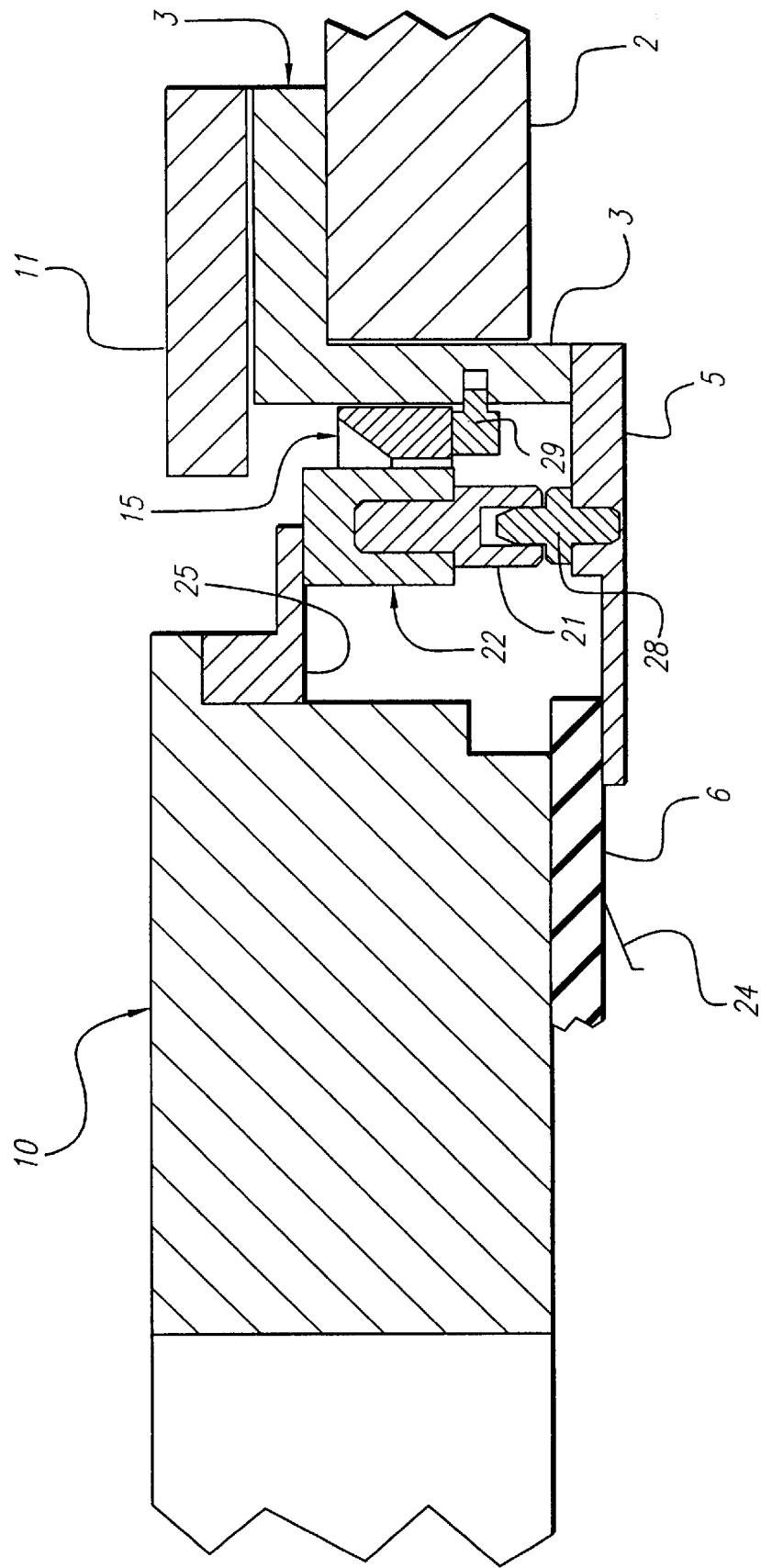
FIG. 4D is another partial section view similar to FIG. 4B and is useful in explaining the alignment feature.

Cam blocks 18 in FIG. 2A are rigidly attached to the upper surface of insert ring 3 by recessed screws 53 (FIG. 4C). Each cam block 18 extends downward to support a corresponding rotatable cam follower element 18A (see FIGS. 3B and 4B) to roll on arcuate upper cam surfaces 16A and thereby retain main lock ring 16 as the ramp surfaces 7 of cam hooks 17 force cam followers 23, and hence POGO tower 10, downward. Cam followers 23 are rigidly attached to the outer side of z-axis ring 22 (rather than to the side of POGO tower 10 as in the prior art.) As rotation of handle 4 in direction 12 proceeds, each of cam followers 23 is forced downward by a ramp surface 7 to a "lock-in" position at the inner end of a corresponding cam follower slot in a cam hook 17.

Rollers 29 are rigidly attached to the lower inner vertical cylindrical surface of insert ring 3 as shown in FIGS. 3A and 4A, allowing the flat bottom surface of main lock ring 16 to ride on rollers 29. The inward orientation of sloped arcuate cam follower surfaces 16A on main locking ring 16 and the corresponding downward-and-inward orientation of cam blocks 18 provides the advantage of allowing the inside diameter of lock ring 16 to be made larger by making the wall of ring 16 thinner. This is because an excessive, horizontal radially outward component of force by cam block 8 on camming surfaces 16A can not cause inward warping or bending of lock ring 16. This is in contrast to the prior art structure shown in FIG. 1, wherein such warping can occur. Furthermore, the top of lock ring 16 in the prior art structure of FIG. 1 must extend above insert ring 16, whereas in the system of FIGS. 2A and 2B the camming surfaces on the top of lock ring 16 can be lower than the upper surface of insert ring 3.

Lid 11 has a large central opening which is generally coextensive with the cylindrical opening in insert ring 3 when lid 11 is in its lowered position. A z-axis ring 22 is positioned beneath lid 11, and is connected thereto in a spring-loaded fashion, as shown in detail in FIGS. 3A and 4A. Z-axis ring 22 has three cam followers 23 rigidly attached to its outer wall, approximately 120 degrees apart. When lid 11 is lowered to its limiting position, cam followers 23 enter into the open ends of the cam slots formed by cam hooks 17.

As shown in FIGS. 3A and 4A, three vertical clearance holes such as 26 spaced about 120 degrees apart extending through z-axis ring 22 to annular flange 22A thereof receive three spring-loaded shoulder bolts 40 which extend upward through holes 26 and are threaded into the bottom of lid 11 as shown. A compression spring 41 is disposed around the shank of each shoulder bolt 40 and is compressed between the shoulder of shoulder bolt 40 and flange 22A of z-axis ring 22 to draw lid 11 and z-axis ring 22 together.

Figure 2B:
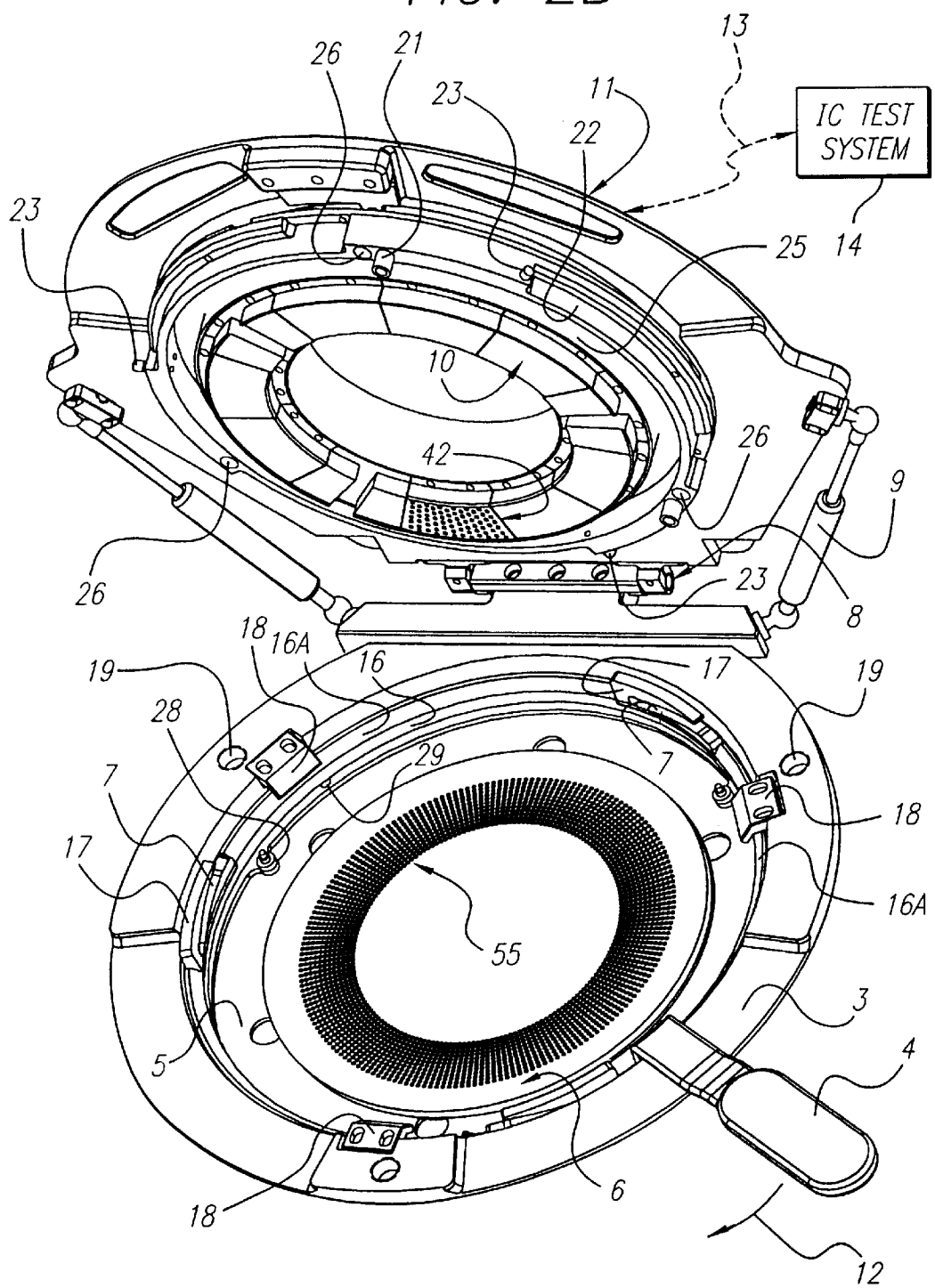
FIG. 2B is a partial perspective view of the interface system of FIG. 2A further including a probe card tray supporting a probe card and a POGO tower supported by a lid assembly.

Referring to FIGS. 2B, 3A and 4A, probe card tray 5 is attached to the bottom edge of insert ring 3 by means of bolts 31. Two spaced-apart alignment bushings 21 are rigidly attached to the bottom flat surface of z-axis ring 22 to receive two corresponding alignment pins 28 (FIGS. 3A, 3B, 4C and 4D). Alignment pins 28, each with a tapered upper end to provide easy insertion into the cylindrical opening in the bottom of two corresponding alignment bushings 21, are attached to probe card tray 5 and extend upwardly from described probe card tray 5 to ensure that z-axis ring 22 is properly aligned with probe card tray 5 as lock ring 16 is rotated to draw POGO tower 10 against probe card 6, POGO tower 10 to probe card 6. (It is to be understood that probe card 6 has alignment holes that receive corresponding alignment pens on probe card tray 5. Similarly, there are alignment holes and corresponding alignment pins that index z-axis ring 22 to adapter ring 25. There are also alignment holes and alignment pins that index adapter ring 25 to POGO tower 10 and hence to POGO pin contacts 42.)

The cable-type POGO tower 10 shown in FIG. 4A includes a plurality of POGO pins 10A each having a lower spring-loaded contact 42 extending below the lower major surface of POGO tower 10 to electrically contact corresponding pads 55 on the upper surface of probe card 6. Each POGO pin 10A also has a spring-loaded upper contact 43 which is pressed against a corresponding conductive pad 56 on the bottom surface of a "performance board" 44 which connects all of the conductive pads 56 to conductors of a cable assembly 45,46,47 connecting the POGO tower 10 to a cable 13 leading to automatic IC test system 14 (FIGS. 2B and 3A).

Probe card 6 rests on the inner edge portion of probe card tray 5, and is aligned therewith by means of alignment pins 32 of probe tray 5 which extend into corresponding alignment holes in probe card 6. Probe needles 24 (FIGS. 3A and 4A) extending downward from the bottom surface of probe card 6, are connected a by corresponding conductive vias and metal conductors to the corresponding above mentioned conductive pads 55 on the upper surface of probe card 6.

Next, and in accordance with an important aspect of the present invention, there are no cam followers on the outer wall of POGO tower 10. Instead, POGO tower 10 (which may have a much smaller outside diameter than illustrated in FIG. 2B) has a rigid flange 10A connected by bolts 34 (FIGS. 4A,4B) to an inexpensive rigid adapter ring 25. Adapter ring 25 is precisely aligned with POGO tower 10 by suitable alignment pins (not shown) in the flange 10A of POGO tower 10 extending into corresponding alignment holes of adapter 25. Adapter ring 25 also is rigidly attached to (and can be integral with) z-axis ring 22 by bolts 34, as shown in FIGS. 4A and 4B. Thus, cam followers 23 of z-axis ring 22 are rigidly attached by adapter 25 and z-axis ring 22 to the outer surface of POGO tower 10.

When lid 11 is lowered, the bottom contacts 42 of POGO pins in POGO tower 10 come to rest at a limiting position so that the lower POGO pin contacts 42 are approximately 0.1 inches above the previously mentioned corresponding electrical contact pads on the upper surface of probe card 6; this configuration is shown in FIGS. 3A, 4A and 4C. Cam followers 23 then are located in the open ends of the cam follower slots formed by cam hooks 17. When handle 4 and main lock ring 16 are rotated in the direction of arrow 12 in FIG. 2B, cam followers 23 engage the sloped cam surfaces 7 of each of the cam hook slots. Since shoulder bolts 40 prevent z-ring 22 from rotating, z-axis ring 22, and hence adapter ring 25 and POGO tower 10, are forced downward against both the resistance of the compression springs 41 around shoulder bolts 40 coupling z-ring 22 to lid 11 and the resistance of the spring-loaded POGO pins at the bottom of POGO tower 10. Spring-loaded lower POGO pin contacts 42 (FIG. 4A) are thereby compressed against conductive pads 55 on probe board 6. This results in an equal and opposite upward reaction force on main locking ring 16 (which may be as much as 500 pounds or even more for some integrated circuit chips). This reaction force is resisted by an equal net downward force produced by the three cam followers 18A of cam blocks 18 on the three arcuate sloped surfaces 16A of main locking ring 16.

The above described interface system includes "standard" components which can be used on all interface systems by providing an assembly including insert ring 3, lock ring assembly 15 and its associated cams, lid 11, z-axis ring 22 and its associated cam rollers and alignment bushings. To "redesign" the system, only the probe card tray 5, probe card 6, POGO tower 10, and adapter ring 25 need to be specified by the user to effectuate a complete redesign. The "standard" parts therefore can be inexpensively maintained as inventory stock.

This greatly reduces the "lead times" for a supplier to provide a redesigned interface system for a user. As an example, if the user decides to replace its present automatic probe machine with a new updated model, and then use it to test more of the same wafers presently being tested using the same IC test system, the interface system can be correspondingly updated by simply providing a new insert ring 3 that is specifically adapted for mounting to the new automatic wafer probe machine. Everything else in the interface system can remain the same. As a practical matter, however, a new insert ring 3, lock ring assembly 15, and z-axis ring 22 usually would be replaced as a unit, because ordinarily the user personnel would not be trained to properly remove the old lock ring assembly 15 and z-axis ring 22. (Since the old z-axis ring 22 and lock ring assembly 15 could be reused, the end user would be credited for the value of these components when a new assembly including the insert ring 3, lock ring assembly 15, and z-axis ring 22 were returned.)

As another example, if the end user needs to test another kind of wafer with substantially different integrated circuit chips therein, a different probe card would be needed, and a different POGO tower might also be needed. In this case, the user simply removes the old POGO tower, adapter ring 25, and probe card. A new adapter ring 25 configured for attachment to the new POGO tower could be quickly provided (without the need for a long lead time). After replacing the old probe card with the new one, the new adapter ring 25 would be attached to the new POGO tower and to z-axis ring 22; the system then would be ready for use.

Furthermore, the same operating protocol and same documentation can be used no matter how many times the interface system is redesigned. This substantially reduces training costs and training time for the user. There is less likelihood of damage to contacts of the POGO pins when POGO towers are removed and replaced. The use of standard components provides a standard "z-axis profile". This always allows perfect mating of any POGO tower to any probe card, and also allows electrical connection of any POGO tower, either of the direct-docking type or the cable-type, to the automatic IC test system. The use of the improved cam block elements and lock rings provide a larger inside diameter of the lock ring and a lower profile for it. This allows larger probe cards to be used than is the case on the otherwise comparable prior art system. Finally, the system allows direct-docking POGO towers and cable-type POGO towers to be completely interchangeable.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

For example, z-axis ring 22 and adapter ring 25 could be integral and be replaced each time a different diameter POGO tower is required. Or, adapter ring 25 could be eliminated and each POGO tower could be constructed to include a flange that extends to a "resident" z-axis ring. Various alternative cam surfaces and cam elements could be utilized. For example, sliding cam surfaces rather than rolling cam elements could be used. The rotatable lock ring could be retained in and rotatable in z-axis ring 22 (instead of in insert ring 16) and the sloped camming surfaces could engage the fixed camming elements in insert ring 16 (instead of z-axis ring 22) to draw POGO tower against the probe card. Rotation of lock ring 16 could be mechanized in various ways, for example by use of air cylinders connected to handle 4.

What is claimed is:

1. A system for interfacing between an integrated circuit die on a semiconductor wafer and (1) an automatic wafer probe machine, and (2) an automatic integrated circuit test system, the interfacing system comprising:
    (a) an insert ring adapted for attachment to a support of the wafer probe machine;
    (b) a lid hingeably attached to the insert ring, a first ring section adapted for rigid connection to a POGO tower, and a mounting assembly connecting the first ring section in spring-loaded relationship to the lid;
    (c) a lock ring assembly including
        i. a lock ring rotatably disposed within a first one of the insert ring and the first ring section, the lock ring having an upper camming surface and a lower camming surface, and
        ii. a cam element attached to the lock ring, the cam element having a sloped camming surface;
    (d) a retaining structure rigidly attached to the first one of the insert ring and the first ring section for engaging the upper and lower camming surfaces to retain the lock ring;
    (e) a probe card support attached to a bottom portion of the insert ring for supporting a probe card in fixed relation to the insert ring;
    (f) a POGO tower assembly including a plurality of POGO pins each having a lower spring-loaded contact for contacting the probe card; and
    (g) a cam follower rigidly attached to a second one of the first ring section and the insert ring for engaging the sloped camming surface when the lid is lowered to position a bottom surface of the POGO tower a predetermined distance above the probe card and following the camming surface lower as the lock ring is rotated in a predetermined direction to force POGO pins at the bottom of the POGO tower against contact pads of the probe card.

2. The system of claim 1 wherein the first one of the insert ring and the first ring section is the insert ring and the second one is the first ring section.

3. The system of claim 1 wherein the mounting assembly includes a second ring section connected in spring-loaded relationship to the lid.

4. A system for interfacing between an integrated circuit die on a semiconductor wafer and (1) an automatic wafer probe machine, and (2) an automatic integrated circuit test system, the interfacing system comprising:
    (a) an insert ring adapted for attachment to a support of the wafer probe machine;
    (b) a lock ring assembly including
        i. a lock ring rotatably disposed within an opening of the insert ring, the lock ring having an upper camming surface and a lower camming surface, and
        ii. a cam element attached to the lock ring, the cam element having a sloped camming surface;
    (c) a support element rigidly attached to the insert ring for engaging the lower camming surface to support the lock ring in the opening;
    (d) a retaining element rigidly attached to the insert ring for engaging the upper camming surface to retain the lock ring in the opening;
    (e) a probe card support attached to a bottom portion of the insert ring for supporting a probe card in fixed relation to the insert ring;
    (f) a lid hingeably attached to the insert ring;

(g) a POGO tower assembly including
   i. a first ring section adapted for rigid connection to a POGO tower,
   ii. a second ring section rigidly connected to the first ring section, and
   iii. a mounting assembly connecting the second ring section in spring-loaded relationship to the lid;

(h) a cam follower rigidly attached to the second ring section for engaging the sloped camming surface when the lid is lowered to position a bottom surface of the POGO tower a predetermined distance above the probe card and following the camming surface lower as the lock ring is rotated in a predetermined direction to force POGO pins at the bottom of the POGO tower against contact pads of the probe card.

5. The system of claim 4 wherein the support element includes a roller element on which the lower camming surface rides as the lock ring 16 rotates.

6. The system of claim 4 including a stop for limiting rotation of the lock ring so that rotation of the lock ring to a limiting position causes a predetermined amount of movement of the POGO tower 10 toward the probe card.

7. The system of claim 4 wherein the POGO tower is a direct docking POGO tower adapted for connection via a performance interface board to the automatic integrated circuit test system.

8. The system of claim 4 wherein the POGO tower is a cable POGO tower adapted for cable connection to the automatic integrated circuit test system.

9. The system of claim 4 including three of the cam elements disposed roughly 120 degrees apart on the lock ring and three of the cam followers rigidly attached to the second ring section.

10. The system of claim 4 wherein the first and second ring sections are separate sections rigidly fastened together by screws.

11. The system of claim 4 including an alignment bushing rigidly connected in fixed relation to one of the probe card supports and the second ring section, and an alignment pin for engaging the alignment busing as the second ring section is drawn toward the probe card by the cam follower to precisely align the POGO tower to the probe card.

12. The system of claim 4 wherein the upper camming surface is an arcuate frustoconical surface disposed on an upper, outer edge portion of the lock ring.

13. The system of claim 12 wherein the retaining element includes a cam roller engaging and rolling on the arcuate frustoconical surface as the lock ring rotates and a cam roller support 18 rigidly attached to the insert ring.

14. The system of claim 4 including a member connected to the lock ring and movable to rotate the lock ring relative to the insert ring.

15. The system of claim 14 wherein the cam follower includes a cylindrical roller engaging the sloped camming surface.

16. A method for modifying an interface between an integrated circuit chip of a semiconductor wafer and (1) a wafer probe machine supporting the wafer, and (2) an integrated circuit test system for electrically testing the chip, the interface including an insert ring attached to the wafer probe machine and supporting a probe card by means of a probe card tray, and a lid hingeably connected to the insert ring and supporting a POGO tower for electrically coupling the integrated circuit test system to the probe card, the method comprising:

(a) providing a POGO tower support assembly including an adapter ring attached to the POGO tower and a z-axis ring including a spring-loaded attachment to the lid;

(b) providing a lock ring assembly for engaging both the z-axis ring and the insert ring to draw the z-axis ring and hence POGO pin contacts of the POGO tower against the probe card and against resistance of the spring-loaded attachment;

(c) if the probe machine is replaced, replacing the insert ring with a replacement insert ring that fits the replacement probe machine, and connecting the adapter ring to the z-axis ring of the replacement lock ring assembly, whereby no change is required to be made to the adapter ring, POGO tower, probe board, or test system; and (d) if the POGO tower is replaced, replacing the adapter ring and attaching the replacement adapter ring to the replacement POGO tower and the z-axis ring, whereby no change is required to be made to the insert ring, lid, or lock ring assembly.

* * * * *